US006394223B1

(12) United States Patent
Lehman

(10) Patent No.: US 6,394,223 B1
(45) Date of Patent: *May 28, 2002

(54) LOUDSPEAKER WITH DIFFERENTIAL ENERGY DISTRIBUTION IN VERTICAL AND HORIZONTAL PLANES

(75) Inventor: Richard W. Lehman, Manheim, PA (US)

(73) Assignee: Clair Brothers Audio Enterprises, Inc., Litiz, PA (US)

( * ) Notice: Subject to any disclaimer, the term of this patent is extended or adjusted under 35 U.S.C. 154(b) by 61 days.

This patent is subject to a terminal disclaimer.

(21) Appl. No.: 09/599,515

(22) Filed: Jun. 23, 2000

Related U.S. Application Data

(60) Provisional application No. 60/124,004, filed on Mar. 12, 1999.

(51) Int. Cl.[7] .................................................. H05K 5/00

(52) U.S. Cl. ....................... 181/152; 181/159; 181/177; 181/187; 381/340

(58) Field of Search ................................ 181/177, 188, 181/187, 185, 191, 152, 155, 159, 192; 381/339, 340, 342

(56) References Cited

U.S. PATENT DOCUMENTS

| | | | | | |
|---|---|---|---|---|---|
| 4,071,112 | A | * | 1/1978 | Keele, Jr. | 181/187 |
| 4,091,891 | A | * | 5/1978 | Hino et al. | 181/185 |
| 4,164,631 | A | * | 8/1979 | Garner et al. | 179/115.5 H |
| 4,187,926 | A | | 2/1980 | Henricksen et al. | |
| 4,308,932 | A | | 1/1982 | Keele, Jr. | |
| 4,344,504 | A | * | 8/1982 | Howze | 181/187 |
| 4,390,078 | A | * | 6/1983 | Howze et al. | 181/185 |
| 4,580,655 | A | | 4/1986 | Keele, Jr. | |
| 4,629,029 | A | | 12/1986 | Gunness | |
| 4,685,532 | A | * | 8/1987 | Gunness | 181/185 |
| 4,845,759 | A | * | 7/1989 | Danley | 381/97 |
| 4,945,334 | A | * | 7/1990 | Biersach | 340/388 |
| 5,020,630 | A | | 6/1991 | Gunness | |
| 5,163,167 | A | | 11/1992 | Heil | |
| 5,524,062 | A | * | 6/1996 | Oh | 381/154 |
| 5,602,366 | A | * | 2/1997 | Whelan et al. | 181/144 |
| 5,750,943 | A | * | 5/1998 | Heinz | 181/152 |
| 5,900,593 | A | | 5/1999 | Adamson | |
| 6,095,279 | A | | 8/2000 | Adamson | |
| 6,112,847 | A | * | 8/2000 | Lehman | 181/152 |

FOREIGN PATENT DOCUMENTS

| | | | | |
|---|---|---|---|---|
| JP | 03022795 A | * | 1/1991 | 181/159 |

* cited by examiner

*Primary Examiner*—Robert E. Nappi
*Assistant Examiner*—Edgardo San Martin
(74) *Attorney, Agent, or Firm*—Burns, Doane, Swecker & Mathis, L.L.P.

(57) ABSTRACT

A loudspeaker horn, loudspeaker and a loudspeaker system wherein at least one loudspeaker includes a horn composed of a waveguide, a plurality of throats acoustically coupled to a single waveguide at their mouths and to respective drivers of a plurality of drivers at their inlets. The axis of the throats form an arc in the plane of the long axis of the waveguide to optimize energy distribution in this plane.

32 Claims, 9 Drawing Sheets

LOUDSPEAKER WITH DIFFERENTIAL ENERGY DISTRIBUTION IN VERTICAL AND HORIZONTAL PLANES

Priority is claimed to copending U.S. application No. 09/267,395 filed Mar. 15, 1999 now U.S. Pat. No. 6,112,847 and U.S. Provisional Application No. 60/124,004 filed Mar. 12, 1999 both of which are herein incorporated by reference.

BACKGROUND OF THE INVENTION (1) Field of the Invention

The present invention relates to the field of loudspeakers and, in particular, to a high power loudspeaker system, a loudspeaker and a loudspeaker horn providing a predefined coverage pattern fed by an optimally shaped wave front created by an array of multiple drivers.

(2) Description of Related Art

In the field of generating and distributing acoustic energy and in particular where the acoustic energy is to be received and recognized by a large number of listeners who are distributed over a given area, many loudspeaker arrangements use multiple horns. Horns generally have an expanding cross-sectional area moving away from the acoustic source such that, in general terms, the horn is used to direct the acoustical energy along the axis of the horn.

Horns have very specific directional acoustical energy distribution characteristics. These characteristics are utilized in applications where the listeners are within a predetermined area relative to the arrangement of the horns. Such applications include but are not limited to open and closed sports arenas, for example.

One conventional directional loudspeaker is disclosed in U.S. Pat. No. 4,344,504 issued to Bruce Howze on Aug. 17, 1982. In this patent, a loudspeaker is disclosed to allegedly have uniform horizontal sound dispersion characteristics in a design angle while having minimal vertical sound dispersion. It utilizes multiple sound energy sources which form an elongated line source of sound energy, and a wave guide having an elongated input portion coextensive with the elongated line source. The planar side walls of the wave guide minimize sound dispersion in a direction parallel to the line source while expanding the sound dispersion in a direction perpendicular to the axis of the line source, thereby differentiating the sound dispersion between vertical and horizontal planes.

In the Howze directional loudspeaker, the line source is formed in a single plane and the mouths of the horns are also in a single plane.

The Howze directional loudspeaker suffers from a number of drawbacks. For instance, vertical sound dispersion is not constant with frequency over the intended bandwidth. Additionally, vertical sound dispersion is preferred in some environments, thus making the Howze directional loudspeaker inappropriate.

BRIEF SUMMARY OF THE INVENTION

It is an object of the present invention to provide a tightly controlled energy distribution pattern in a horizontal plane over a broad frequency range.

It is another object of the present invention to provide a tightly controlled energy distribution pattern in a vertical plane over a broad frequency range.

It is still another object of the present invention to significantly increase the amount of acoustic energy in a defined area, as compared to a commonly used single driver horn.

It is still yet another object of the present invention to provide a coherent acoustical wave front that mimics a single idealized point source with a defined energy distribution pattern.

It is still yet a further object of the present invention to eliminate or ameliorate to insignificance the interference patterns caused by multiple time arrivals in horn arrangements which are specifically designed to increase the energy density over a defined area by overlap of multiple single driver horn patterns on the defined area.

It is still yet another object of the present invention to optimize the amount of acoustical energy delivered by an array of multiple driver horns to a defined area by adjustment of the vertical and/or horizontal coverage angles of the individual multiple driver horns in the array.

It is yet another object of the present invention to optimize the amount of acoustical energy delivered by an array of multiple driver horns to a defined area by adjustment of the vertical and/or horizontal angles of individual vanes located in an area in front of the mouth of a throat section or mouths of the throat sections.

These and other objects and advantages are achieved by providing a horn including a plurality of electroacoustical drivers for generating sound waves over a range of frequencies and each having a sound outlet port; a plurality of throat sections each having an axis and each extending from an inlet to a mouth, wherein inlet of respective throat sections of the plurality of throat sections are acoustically coupled to the outlet ports of respective drivers of the plurality of drivers, whereby the mouths of the plurality of throat sections are disposed on an arcuate array in a first plane.

The present invention may also be embodied in a loudspeaker including a housing and at least one of the above described inventive horns.

The present invention may further be embodied in a loudspeaker system including a plurality of loudspeakers, at least one of the plurality of loudspeakers having a housing and at least one inventive horn. Further, the loudspeaker system may include a plurality of loudspeakers in the form of an array wherein at least one loudspeaker is at an angle (greater than 0°, and less than 180°) relative to an adjacent loudspeaker.

BRIEF DESCRIPTION OF THE DRAWINGS

The present invention will now be described by way of exemplary embodiments to which it is not limited as illustrated in the accompanying drawings, in which.

DETAILED DESCRIPTION OF THE INVENTION

Figure 1:
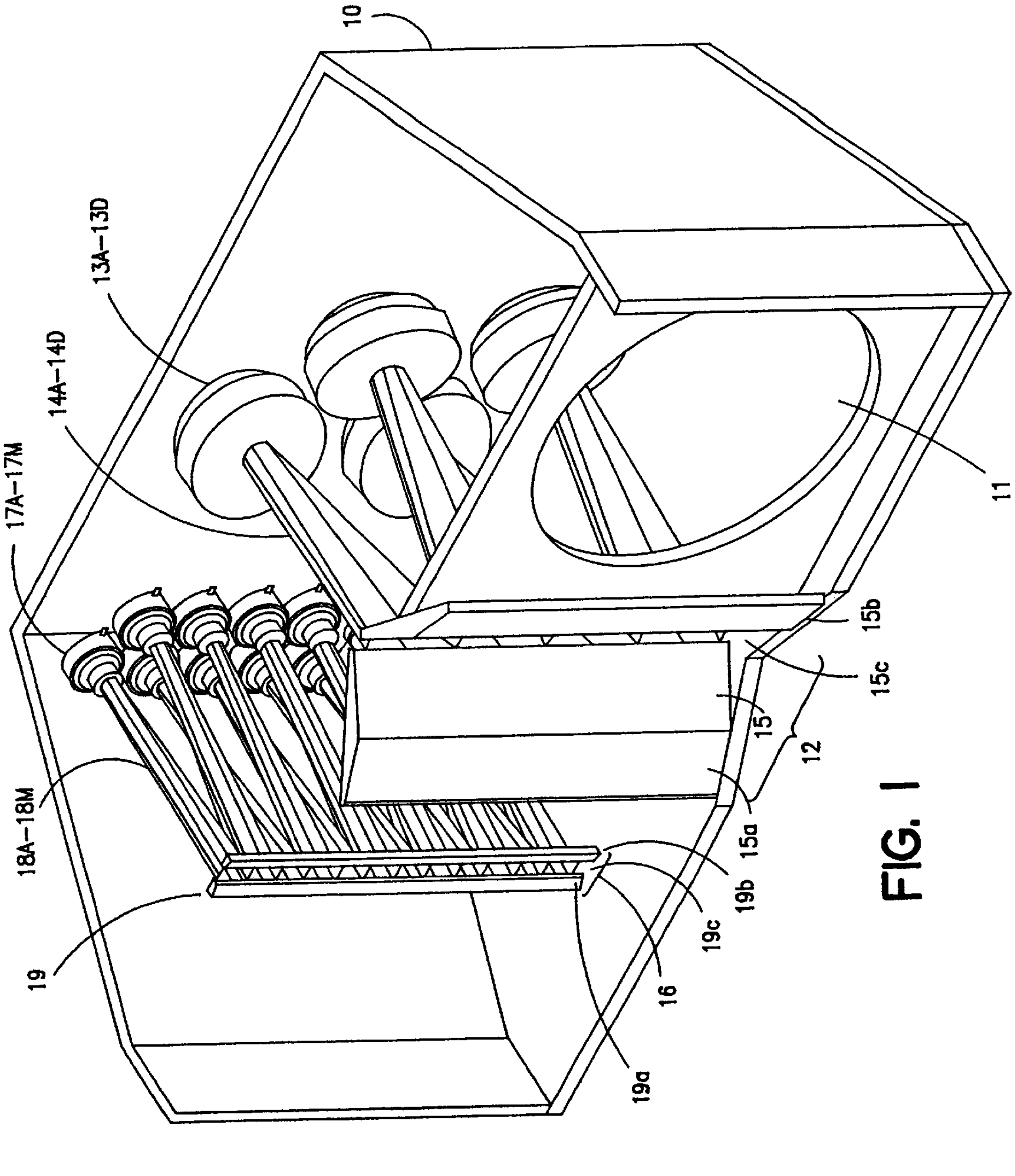
FIG. 1 is a perspective drawing of one embodiment of a full range loudspeaker system incorporating the present invention.

FIG. 1 illustrates a loudspeaker of a high fidelity speaker system. It includes a shell or housing 10. In the housing 10 are a woofer, mid-range speakers, and tweeters. The woofer mount 11 with an aperture for the woofer is shown in FIG. 1. The woofer and four conventional mid-range speakers are shown in each of the twelve loudspeaker cabinets of FIG. 7. As is conventional, the woofer produces sound in the range of 200 Hz or less.

Adjacent to the mount 11 for the woofer is a center horn 12 in accordance with the present invention which provides sound in a much higher and broader range (e.g., 1.5–20 kHz range), and can be considered a mid-range to tweeter speaker. The center horn 12 consists of a plurality of center array drivers (e.g., four drivers) 13*a*–13*d* which are acoustically coupled to respective center throats of an array of center throats 14*a*–14*d*. These center throats 14*a*–14*d* are offset relative to an immediately neighboring throat by a given angle in a direction perpendicular to a plane of symmetry between the throats as shown. Hence, a sum of the individual widths of the several drivers in a first direction can be greater than the total height of the drivers in the array in the illustrated embodiment. However, they can be placed in a single plane. Also, if desired, the individual throats 14*a*–14*d* can be partially or completely separated from each other by some form of divisor structure, such as vanes, rigid or flexible walls, membranes, webbing or other physical partition, etc.

The output ports of the center array drivers 13*a*–13*d* are acoustically coupled to the inlets of the center throats 14*a*–4*d*. The mouths of the center throats 14*a*–4*d* are acoustically coupled to a single center array waveguide 15. The array drivers 13*a*–13*d*, the throats 14*a*–4*d*, and the single waveguide 15 thus constitute the center horn 12.

Figure 2:
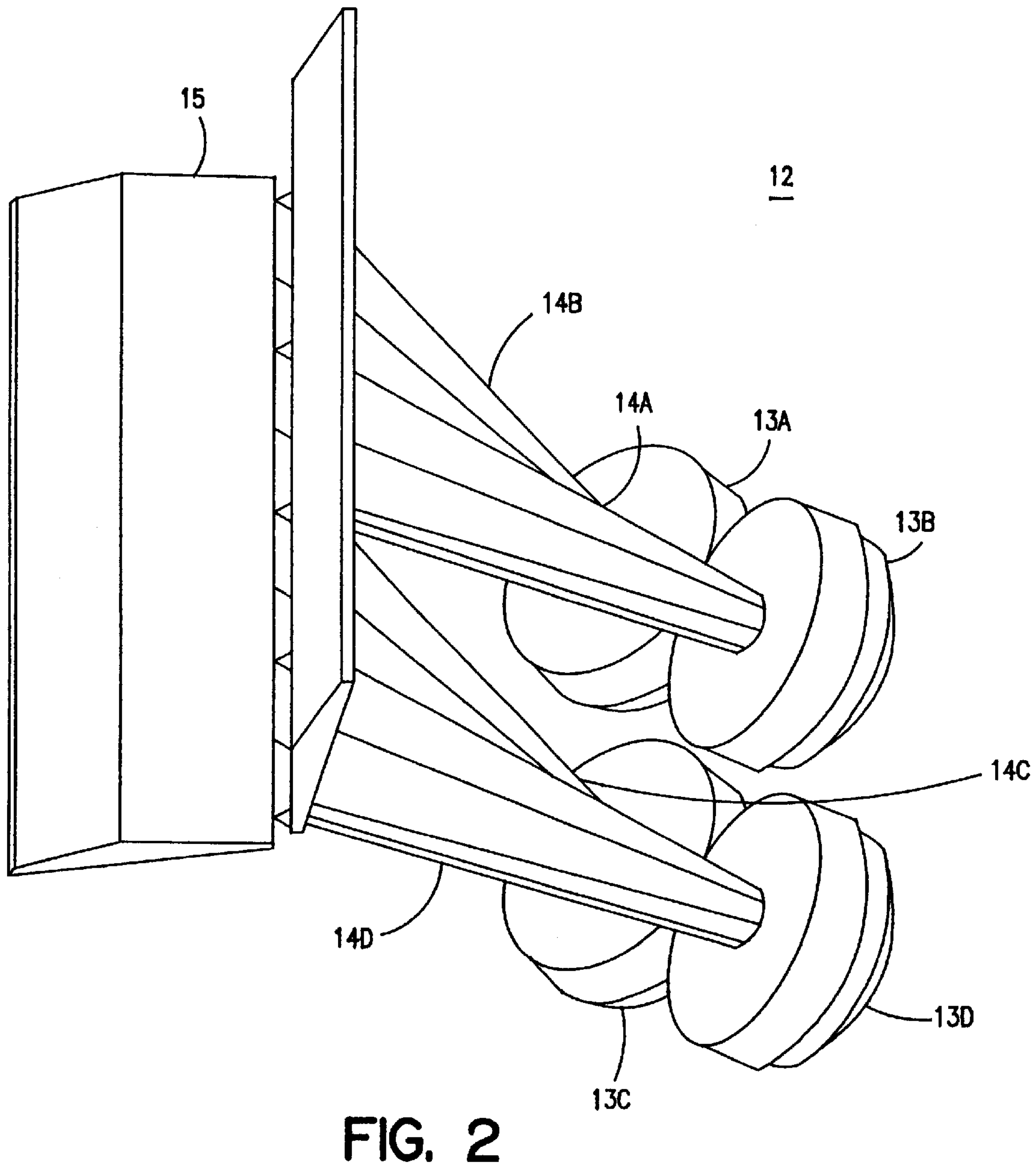
FIG. 2 is a perspective drawing of the center horn with four center throats and the waveguide which controls the horizontal energy distribution pattern of the loudspeaker shown in FIG. 1.
Figure 3:
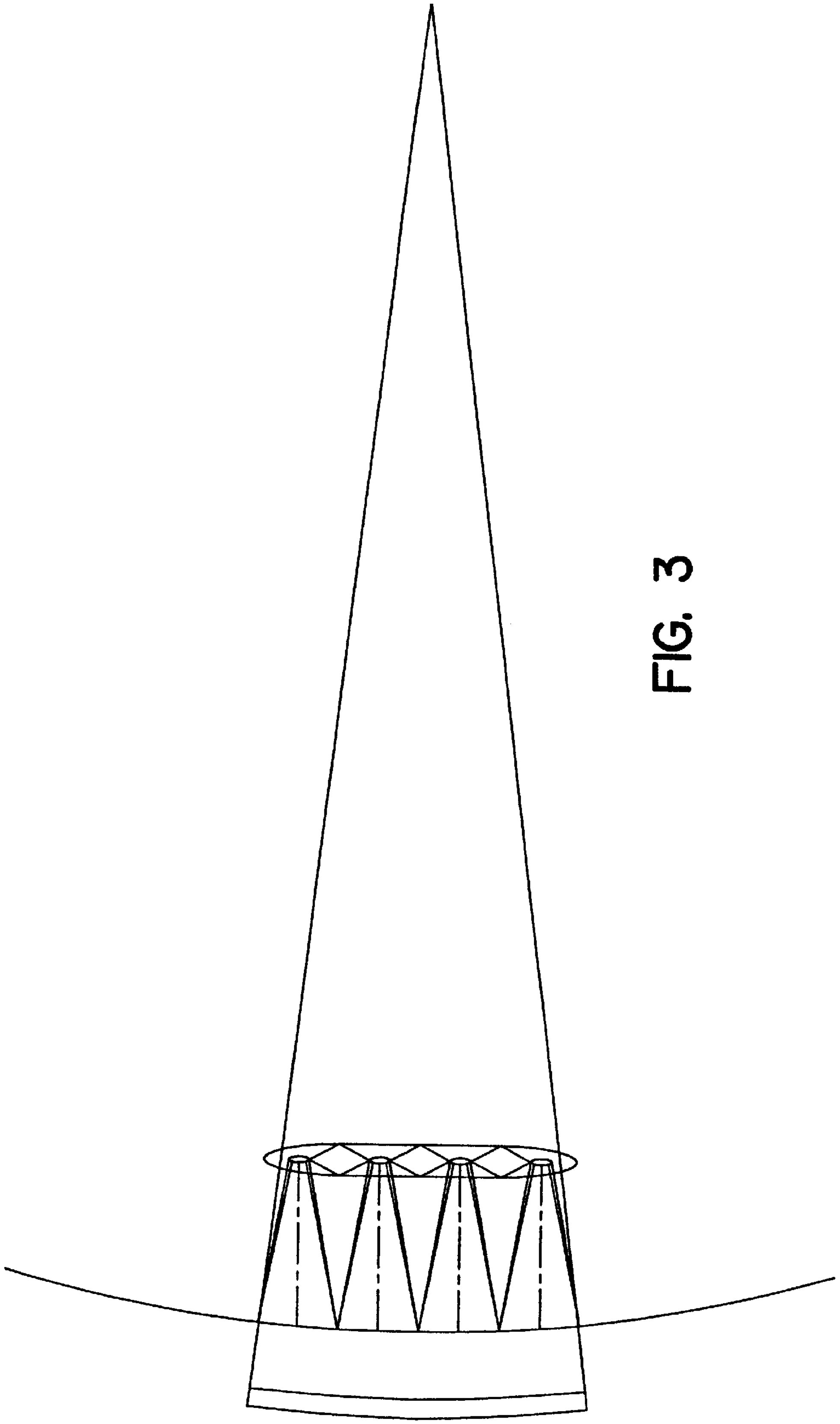
FIG. 3 is a side view of the center horn with four center throats shown in FIG. 2 illustrating the vertical angle of coverage of the present invention.

As illustrated in FIGS. 2 and 3, the axis of the throats 14*a*–4*d* of the center horn 12 form an arcuate array in the vertical plane. It should be noted that, while the terms vertical and horizontal are used as points of reference, these terms can be interchanged without affecting the invention. In fact, any orientation of the various elements with respect to a reference plane is contemplated. The center array waveguide 15 is shaped as an arc in the vertical plane as illustrated in FIG. 3.

Similarly, the small horn 16 includes a plurality (e.g., 12) of drivers 17*a*–17*m* acoustically coupled to small array throats 18*a*–18*m*. As with the center array waveguide 15, the small array throats 18*a*–18*m* are acoustically coupled to a single small array waveguide 19. The operation and construction of the small horn 16 is much the same as the center horn 12 but for the inclusion of additional drivers 17*a*–17*m* which provide extra power in the high frequency ranges, as well as smaller throats 18*a*–18*m* and waveguide 19 dimensions to generate sounds in the range of 6 kHz and up. The small horn 16 may be considered a tweeter.

It should be noted that on either side of the small horn 16 can be placed mid-range speakers (shown in FIG. 7), such as four evenly spaced mid-range speakers, two on either side of the small horn 16 in stacked relationship. The mounts for the two sets of two mid-range horns may form a chevron shape with the center of the chevron on either side of the small horn 16 and extending to the outer surface of the housing 10. The center horn 12 can have an overlapping range to the tweeter 16, and hence the tweeter 16 can be omitted under some circumstances.

With respect to center horn waveguide 15 and the similar construction of the small horn waveguide 19, these waveguides' outer surfaces on the sides 15*a*, 15*b* (and 19*a*, 19*b*) have two angles relative to the central plane of the throats 14*a*–14*d* (and 18*a*–18*m*). The center plane is referred to as the "0" line in FIGS. 4A and 4B, for instance.

The waveguides 15 and 19 of the center and small horns 12 and 16 can include complete top and bottom sides 19*c* (only one shown as the top side of the housing 10 is omitted for illustration) as shown with respect to the waveguide 19 of the small array 16 or have vestigial top and bottom side walls 15*c*, e.g., with a chevron cut out at an angle matching the more posterior side surface of the waveguides 15*a*, 15*b*, 19*a*, 19*b*. Alternatively, the waveguide top and bottom side walls may be omitted.

Figure 4A:
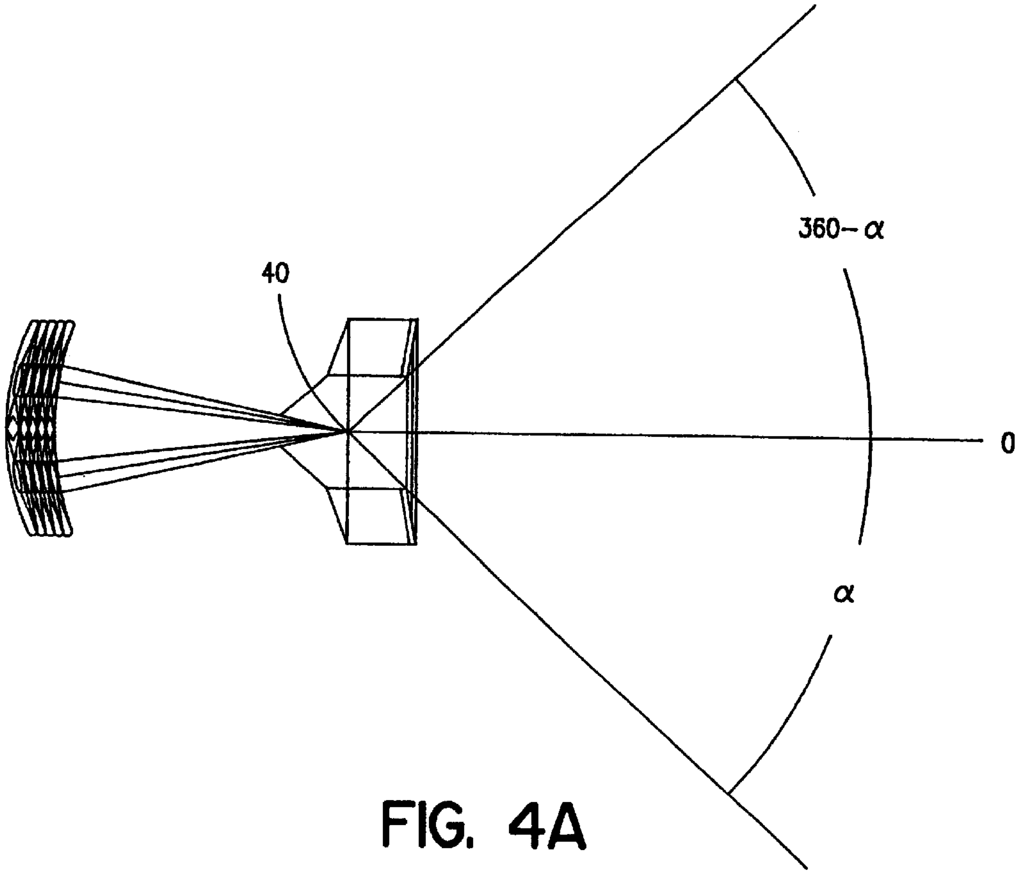
FIG. 4A is a top view of a small array showing the horizontal coverage of the loudspeaker within an array.

FIG. 4A is a top view of the center horn 12 showing the horizontal coverage. The angle $\alpha$ is the angle of propagation relative to a center, vertical plane of the array. The angle $\alpha$ may be slightly different than the innermost surface of the waveguide 12 (or 16). An outer edge of sound distributed by the horn is approximately in a horizontal plane and approximates the angle of the inner surface (e.g., 15*a*') of side surface (e.g., 15). This line of intersection 40 is to the rear of the mouths of the throats 14*a*–14*d*.

Figure 4B:
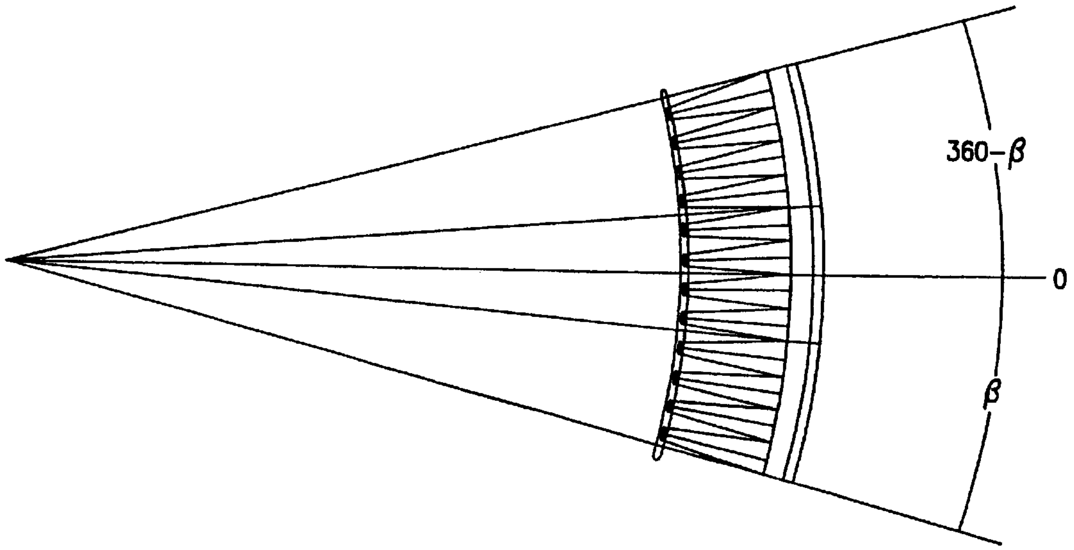
FIG. 4B is a side view of three of the center horns arrayed in a vertical plane.

FIG. 4B illustrates use of three horns 12, one stacked upon the other with each horn maintaining the arcuate relationship of the individual throats 14*a*–4*d* of each horn 12 in the vertical plane in a proper array.

Figure 5A:
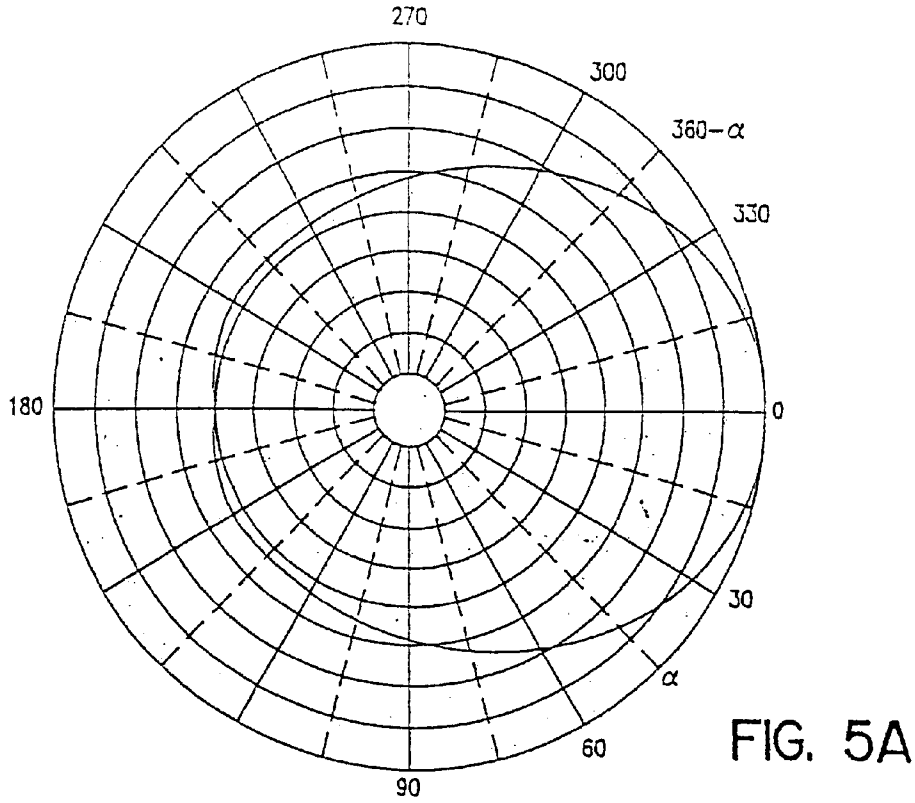
FIG. 5A and 5B are graphic representations of the vertical and horizontal energy distributions, respectively, of the array shown in FIGS. 4A and 4B.
Figure 5B:
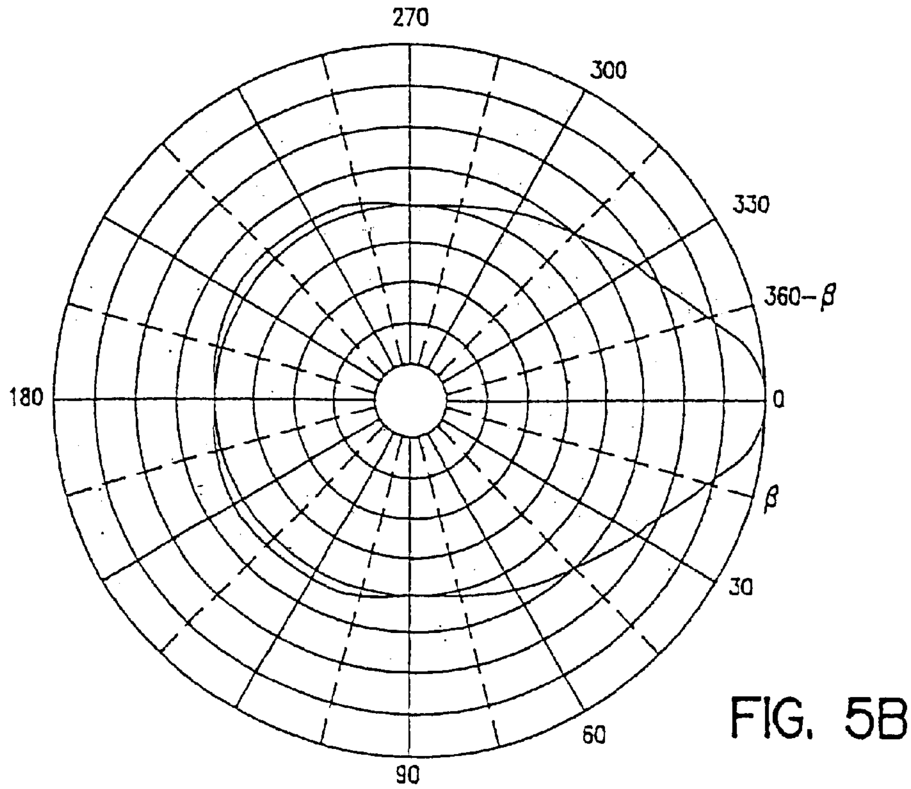

FIG. 5A is a polar plot of the horizontal energy distribution, whereas FIG. 5B is a polar plot of the vertical energy distribution of the arrays shown in FIGS. 4A and 4B. Marks for $\alpha$ and 360–$\alpha$ in the plot of FIGS. 4A correspond to similar marks in FIG. 5A and likewise marks $\beta$ and 360–$\beta$ of FIG. 4B correspond to similar marks in FIG. 5B. As illustrated, it can be seen that the energy distribution is very efficient.

Figure 6:
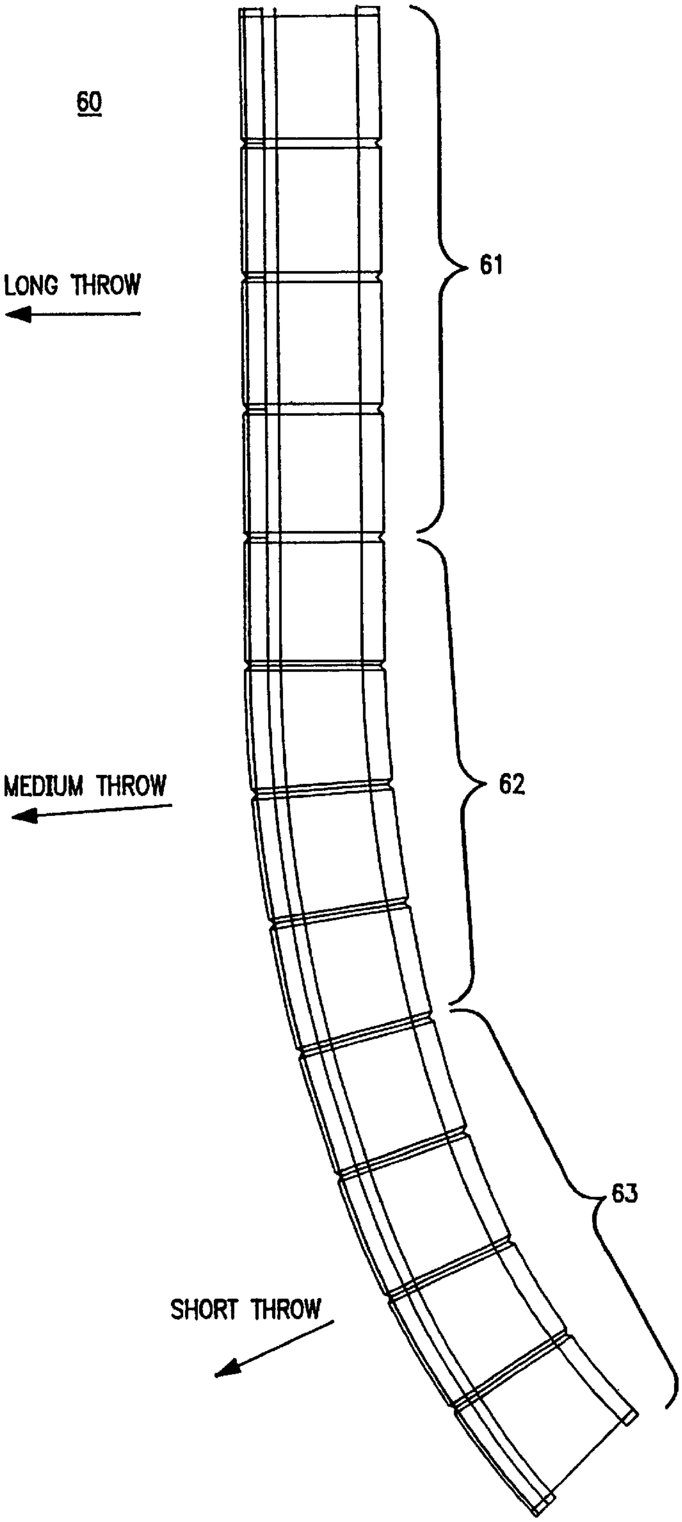
FIG. 6 is an array of loudspeakers incorporating the present invention.
Figure 7:
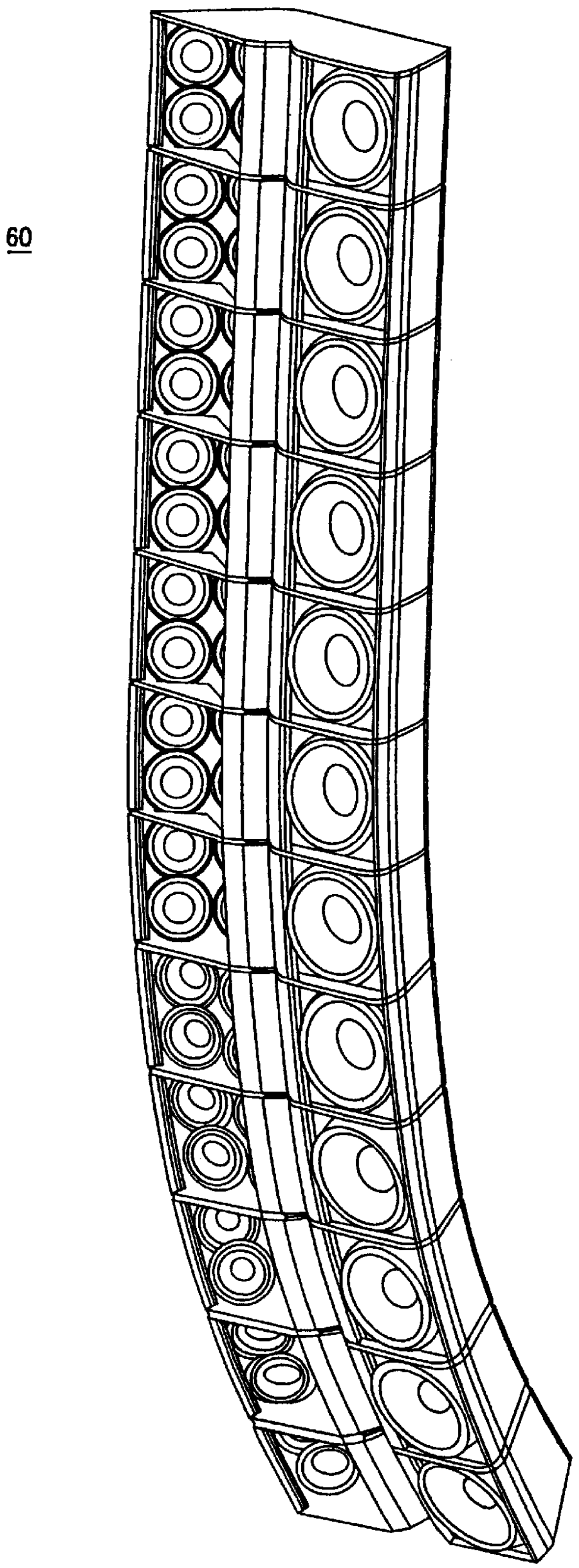
FIG. 7 is an oblique view of the array of loudspeakers shown in FIG. 6.

FIGS. 6 and 7 illustrate arrays of loudspeakers 60, each loudspeaker or at least one of the loudspeakers being in accordance with the present invention. As illustrated in FIG. 6, four such loudspeakers 61 are at nearly 90° to the horizontal plane and at nearly 0° in the vertical plane to project the sound a long distance (i.e., a long throw). FIG. 6 also shows four speakers 62 in an arcuate array each being offset from its neighbor by 5°. This arrangement projects sound a medium distance or a medium throw. The last set of four speakers 63 are offset from one another by 10° and projects sound a relatively short distance or short throw. FIG. 7 is an oblique view of the array shown in FIG. 6 wherein all of the speakers are in accordance with the present invention.

From the forgoing, it can be seen that the present invention can provide a tightly controlled energy distribution pattern in a horizontal plane over a broad frequency range by means of a plurality of drivers 13, 17 respectively coupled to respective horizontally offset throat sections 14, 18, which are in turn coupled to a single waveguide 15, 19.

Figure 8:
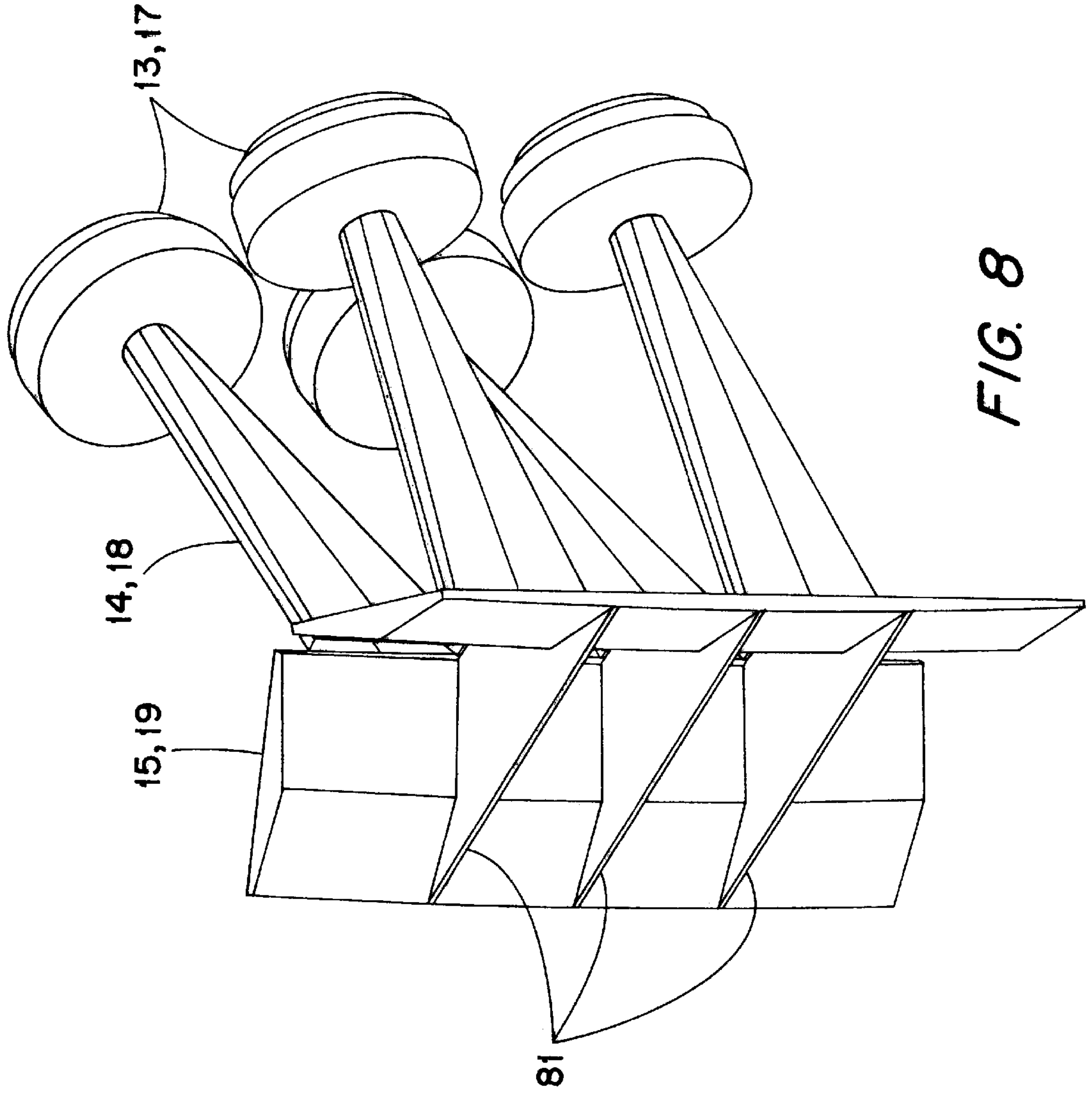
FIG. 8 is a perspective drawing of, the center horn or part of the small array with four throats and the waveguide with horizontal vanes which influence the vertical energy distribution pattern of the loudspeaker shown in FIG. 1.
Figure 9:
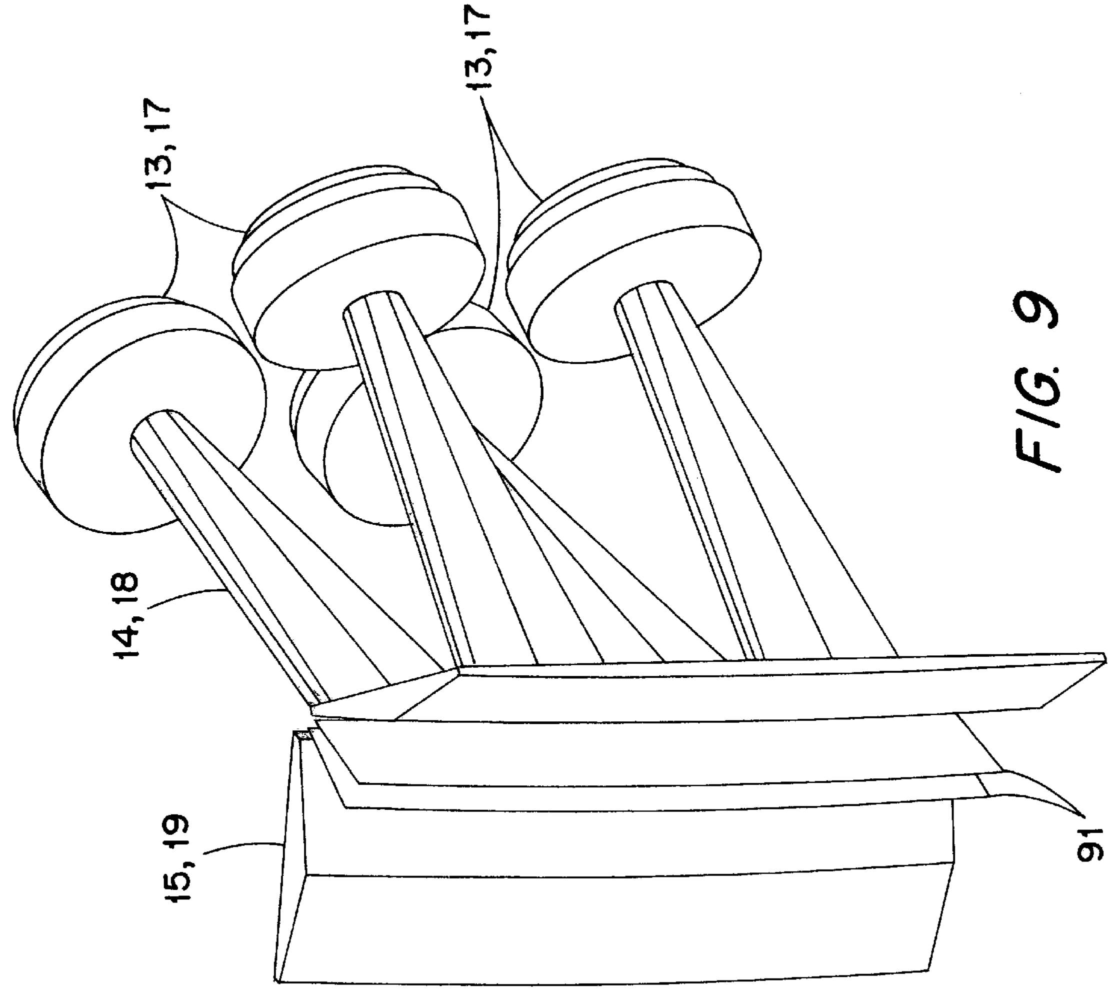
FIG. 9 is a perspective drawing of the center horn or part of the small array with four throats and the waveguide with vertical vanes which influence the horizontal energy distribution pattern of the loudspeaker shown in FIG. 1.

In addition, one or more vertical and/or horizontal vanes 81, 91 can be added in front of the throats. These vanes 81, 91 can be added to a single waveguide 15, 19, as shown in FIGS. 8 and 9. Specifically, as shown in FIG. 8, horizontal vanes 81 are provided which bridge opposing surfaces of the single waveguide 15, 19 from the innermost point of the single waveguide 15, 19 closest to the throat sections 14, 18 to the outermost point of the single waveguide 15, 19. The vanes 81 can have a chevron shape on their outermost edge similar to the upper and lower ends of the single waveguide 15, 19, or not extend to the outermost point, not extend to the innermost point, or neither the outermost or innermost points of the single waveguide 15, 19. Respective vanes 81 can be located at the position that adjacent throat sections 14, 18 meet the single waveguide 15, 19 either in one-to-one correspondence or at some ratio such as one vane for every other pair of throat sections 14, 18. Alternatively, the vanes 81 can divide the mouths of one or more throat sections 14, 18.

As shown in FIG. 9, vertical vanes 91 are provided which extend from the top to the bottom of the single waveguide 15, 19 in a region located between the sides of the single waveguide 15, 19 and follow the same arcuate shape as the single waveguide. These horizontal vanes 91 can be as deep as the single waveguide 15, 19, or not extend to the outermost point, not extend to the innermost point, or neither the outermost or innermost points of the single waveguide 15, 19. The horizontal and the vertical vanes 81, 91 can be combined in a single embodiment, either such that they overlap one another or intersect one another.

These vanes 81, 91 may serve to adjust energy distribution by adjusting the angles of the vertical vanes 81 to match the angles of the throat sections 14, 18 in forming the arcuate line, or deliberately not match these angles, depending on the effect desired. Similarly, the horizontal vanes 91 can follow an even radial pattern or deviate in angle from the radial line 40 illustrated in FIG. 4, depending on the effect desired.

The present invention also provides a tightly controlled energy distribution pattern in a vertical plane over a broad frequency range by means of aligning axes of the plurality of throat sections form an arcuate array in the vertical plane.

The present invention further significantly increases the amount of acoustic energy in a defined area, as compared to a commonly used single driver horn by this inventive arrangement.

By this arrangement, the present invention additionally provides a coherent acoustical wave front that mimics a single idealized point source with a defined energy distribution pattern.

By this arrangement, the present invention eliminates or ameliorates to insignificance the interference patterns caused by multiple time arrivals in horn arrangements which are specifically designed to increase the energy density over a defined area by overlap of multiple single driver horn patterns on the defined area.

The present invention optimizes the amount of acoustical energy delivered by an array of multiple driver horns to a defined area by adjustment of the vertical and/or horizontal coverage angles of the individual multiple driver horns in the array.

The present invention has been described by way of exemplary embodiments to which it is not limited. Modifications and variations will occur to those skilled in the art without departing from the scope and spirit of the invention as reflected in the appended claims.

What is claimed is:

1. A horn comprising:

a plurality of electroacoustical drivers for generating sound waves over a range of frequencies, each having a sound outlet port; and a plurality of throat sections each having an axis and each extending from an inlet to a mouth, wherein inlets of respective throat sections of said plurality of throat sections are acoustically coupled to said outlet ports of respective drivers of said plurality of drivers, wherein said mouths of said plurality of throat sections are disposed on an arcuate line in a first plane.

2. The horn according to claim 1, wherein said axes of said plurality of throat sections form an arcuate array with a point of convergence on the driver side of the horn.

3. The horn according to claim 1, wherein alternating throat sections are in a plane which is offset by a given angle relative to said first plane.

4. The horn according to claim 1, wherein said plurality of throat sections are in said first plane.

5. The horn according to claim 1, further comprising at least one vane located in an area in front of said plurality of throat sections.

6. The horn according to claim 1, wherein said at least one vane has a long axis parallel to said first plane.

7. The horn according to claim 1, wherein said at least one vane has a long axis perpendicular to said first plane.

8. The horn according to claim 1, further comprising:

a single waveguide, wherein said single waveguide includes at least one vane, and wherein said mouths of respective throats of said plurality of throat sections are acoustically coupled to said single waveguide.

9. The horn according to claim 8, wherein said at least one vane of said single waveguide has a long axis parallel to said first plane.

10. The horn according to claim 8, wherein said at least one vane of said single waveguide has a long axis perpendicular to said first plane.

11. The horn according to claim 8, wherein said single waveguide includes a slot each side of which is formed by an anterior surfaces and a posterior surfaces, the anterior surfaces forming a smaller angle to said first plane than said posterior surfaces.

12. The horn according to claim 8, wherein said waveguide includes vestigial top and bottom sides.

13. The horn according to claim 8, wherein the directional pattern distributed by said horn projected onto a second plane perpendicular to said first plane approximately intersects the anterior surfaces of said waveguide in a horizontal direction and the axial lines of the outermost respective throat sections within said horn in a vertical direction.

14. A horn array comprising:

a plurality of horns in an array, each horn including:

a plurality of electroacoustical drivers for generating sound waves over a range of frequencies, each having a sound outlet port; and a plurality of throat sections each having an axis and each extending from an inlet to a mouth, wherein inlets of respective throat sections of said plurality of throat sections are acoustically coupled to said outlet ports of respective drivers of said plurality of drivers, wherein said mouths of said plurality of throat sections are disposed on an arcuate line in a first plane.

15. The horn array according to claim 14, wherein at least one horn of said array is at an angle relative to an adjacent horn.

16. The horn array according to claim 14, further comprising at least one vane located in an area in front of said plurality of throat sections.

17. The horn array according to claim 16, wherein said at least one vane has a long axis parallel to said first plane.

18. The horn array according to claim 16, wherein said at least one vane has a long axis perpendicular to said first plane.

19. The horn array according to claim 14, further comprising:

a single waveguide, wherein said single waveguide includes at least one vane, and wherein said mouths of respective throats of said plurality of throat sections are acoustically coupled to said single waveguide.

20. The horn array according to claim 19, wherein said at least one vane of said single waveguide has a long axis parallel to said first plane.

21. The horn array according to claim 19, wherein said at least one vane of said single waveguide has a long axis perpendicular to said first plane.

22. A loudspeaker comprising:

a housing; and at least one horn including a plurality of electroacoustical drivers for generating sound waves over a range of frequencies, each having a sound outlet port: and a plurality of throat sections each having an axis and each extending from an inlet to a mouth, wherein inlets of respective throat sections of said plurality of throat sections are acoustically coupled to said outlet ports of respective drivers of said plurality of drivers, wherein said mouths of said plurality of throat sections are disposed on an arcuate line in a first plane.

23. The loudspeaker according to claim 22, further comprising at least one vane located in an area in front of said plurality of throat sections.

24. The loudspeaker according to claim 22, wherein said at least one vane has a long axis parallel to said first plane.

25. The loudspeaker according to claim 22, wherein said at least one vane has a long axis perpendicular to said first plane.

26. The loudspeaker according to claim 22, further comprising:

a single waveguide, wherein said single waveguide includes at least one vane, and wherein said mouths of respective throats of said plurality of throat sections are acoustically coupled to said single waveguide.

27. A loudspeaker system comprising:

a plurality of loudspeakers, at least one of said plurality of loudspeakers including:

a housing; and at least one horn including a plurality of electroacoustical drivers for generating sound waves over a range of frequencies, each having a sound outlet port; and a plurality of throat sections each having an axis and each extending from an inlet to a mouth, wherein inlets of respective throat sections of said plurality of throat sections are acoustically coupled to said outlet ports of respective drivers of said plurality of drivers, wherein said mouths of said plurality of throat sections are disposed on an arcuate line in a first plane.

28. The loudspeaker system according to claim 27, wherein said plurality of loudspeakers form an array wherein at least one loudspeaker is at an angle relative to an adjacent loudspeaker.

29. The loudspeaker system according to claim 27, wherein said at least one horn further comprises at least one vane located in an area in front of said plurality of throat sections.

30. The loudspeaker system according to claim 29, wherein said at least one vane has a long axis parallel to said first plane.

31. The loudspeaker system according to claim 29, wherein said at least one vane has a long axis perpendicular to said first plane.

32. The loudspeaker system according to claim 27, wherein said at least one horn further comprises:

a single waveguide, wherein said single waveguide includes at least one vane, and wherein said mouths of respective throats of said plurality of throat sections are acoustically coupled to said single waveguide.

* * * * *